US009543978B2

(12) United States Patent
Mattisson et al.

(10) Patent No.: US 9,543,978 B2
(45) Date of Patent: Jan. 10, 2017

(54) FREQUENCY SELECTIVE CIRCUIT CONFIGURED TO CONVERT AN ANALOG INPUT SIGNAL TO A DIGITAL OUTPUT SIGNAL

(71) Applicant: Telefonaktiebolaget L M Ericsson (publ), Stockholm (SE)

(72) Inventors: Sven Mattisson, Bjärred (SE); Martin Anderson, Löddeköpinge (SE); Pietro Andreani, Lund (SE); Mattias Palm, Bara (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/769,164

(22) PCT Filed: Feb. 21, 2013

(86) PCT No.: PCT/EP2013/053424
§ 371 (c)(1),
(2) Date: Aug. 20, 2015

(87) PCT Pub. No.: WO2014/127821
PCT Pub. Date: Aug. 28, 2014

(65) Prior Publication Data
US 2016/0036460 A1    Feb. 4, 2016

(51) Int. Cl.
*H03M 3/00* (2006.01)
(52) U.S. Cl.
CPC .............. *H03M 3/464* (2013.01); *H03M 3/344* (2013.01); *H03M 3/454* (2013.01); *H03M 3/368* (2013.01)
(58) Field of Classification Search
CPC ...... H03M 3/464; H03M 3/454; H03M 3/388; H03M 3/456; H03M 3/424; H03M 3/438; H03M 3/404; H03M 3/396; H03M 3/458; H03M 3/394; H03M 3/406; H03M 3/452; H03M 3/344; H03M 3/368
(Continued)

(56) References Cited

U.S. PATENT DOCUMENTS

| 5,392,042 A * | 2/1995 | Pellon | H03M 3/404 341/143 |
| 6,271,781 B1 * | 8/2001 | Pellon | H03M 3/388 341/143 |

(Continued)

FOREIGN PATENT DOCUMENTS

| EP | 2405580 A1 | 1/2012 |
| WO | 2005002059 A1 | 1/2005 |

(Continued)

OTHER PUBLICATIONS

Breems, et al., "Sigma-Delta Modulation for A/D Conversion in Radio Receivers", Kluwer Academic Publishers, 2001, 29-49.

(Continued)

*Primary Examiner* — Lam T Mai
(74) *Attorney, Agent, or Firm* — Murphy, Bilak & Homiller, PLLC

(57) ABSTRACT

A frequency selective circuit configured to convert an analog input signal to a digital output signal comprises an analog-to-digital converter (44) to generate the digital output signal of the circuit based on an analog input signal to the analog-to-digital converter (44); a digital-to-analog converter (46, 47) to generate an analog feedback signal based on the digital output signal from the analog-to-digital converter (44), and an analog filter arranged to generate the analog input signal to the analog-to-digital converter based on the analog feedback signal and an analog input signal to the circuit. The analog filter comprises at least two integrators (41, 42) in series, each having a feedback path comprising the analog-to-digital converter (44) in cascade with a digital- (Continued)

to-analog converter (46, 47), so that the overall noise transfer function of the circuit has at least two zeros in addition to zeros in the noise transfer function of the analog-to-digital converter.

17 Claims, 11 Drawing Sheets

(58) Field of Classification Search
    USPC .................................................. 341/110–155
    See application file for complete search history.

(56) References Cited

U.S. PATENT DOCUMENTS

| | | | | |
|---|---|---|---|---|
| 6,414,615 | B1* | 7/2002 | Cheng | H03M 3/37 |
| | | | | 341/143 |
| 7,075,468 | B1* | 7/2006 | Pellon | H03M 3/37 |
| | | | | 341/143 |
| 8,072,363 | B2* | 12/2011 | Yu | H03M 3/408 |
| | | | | 341/143 |
| 8,159,380 | B2 | 4/2012 | Le Guillou et al. | |
| 8,581,762 | B2* | 11/2013 | Sosio | H03M 3/344 |
| | | | | 341/143 |
| 2008/0297385 | A1* | 12/2008 | Clara | H03M 3/394 |
| | | | | 341/143 |
| 2012/0139764 | A1 | 6/2012 | Sosio et al. | |
| 2014/0077984 | A1* | 3/2014 | Shu | H03M 3/37 |
| | | | | 341/143 |

FOREIGN PATENT DOCUMENTS

| | | |
|---|---|---|
| WO | 2007085997 A1 | 8/2007 |
| WO | 2012073117 A1 | 6/2012 |

OTHER PUBLICATIONS

Breems, L. et al., "A Cascaded Continuous-Time Modulator With 67-dB Dynamic Range in 10-MHz Bandwidth", IEEE Journal of Solid-State Circuits, vol. 39, No. 12, Dec. 12, 2014, 2152-2160.

Greenberg, J. et al., "A 40MHz-to-1GHz Fully Integrated Multistandard Silicon Tuner in 80nm CMOS", IEEE International Solid-State Circuits Conference Digest of Technical Papers, 2012, 162-164.

Kwan, Hing-Kit et al., "Design of Hybrid Continuous-Time Discrete-Time Delta-Sigma Modulators", Circuits and Systems, 2008. ISCAS 2008. IEEE International Symposium on, IEEE, Piscataway, NJ, USA, May 18, 2008, 1224-1227.

Philips, K et al., "A Continuous-Time (Delta Sigma) ADC With Increased Immunity to Interferers", IEEE Journal of Solid•State Circuits. vol. 39. No. 12, Dec. 2005, 2170-2178.

Sosio, M. et al., "A 2G/3G Cellular Analog Baseband Based on a Filtering ADC", IEEE Transactions on Circuits and Systems II: Express Briefs, vol. 59, No. 4, Apr. 2012, 214-218.

Sosio, M. et al., "A complete DVB-T/ATSC tuner analog base-band implemented with a single filtering ADC", IEEE Proceedings of European Solid-State Circuits Conference, 2011,391-394.

\* cited by examiner

FREQUENCY SELECTIVE CIRCUIT CONFIGURED TO CONVERT AN ANALOG INPUT SIGNAL TO A DIGITAL OUTPUT SIGNAL

TECHNICAL FIELD

The invention relates to a frequency selective circuit configured to convert an analog input signal to a digital output signal, comprising an analog-to-digital converter, a digital-to-analog converter and an analog filter.

The work leading to this invention has received funding from the European Atomic Energy Community Seventh Framework Program (FP7/2007-2013) under grant agreement n° 248277.12.

BACKGROUND

In radio frequency or wireless communication systems, a radio frequency (RF) receiver is a fundamental building block. The zero- and low-IF receiver (RX) architectures dominate today's low-cost wireless receiver market. For such receivers, the wanted signal is down-converted to DC, or close to DC, by the RX mixer. Before this mixer, the only frequency selectivity provided is, typically, band selectivity via the duplexer or the RX (surface-acoustic wave, SAW) filter (for frequency-division duplex, FDD, or time-division duplex, TDD, systems, respectively). In the RX-band adjacent-channel signals and leakage from the terminal's own transmitter (TX) may be much stronger than the wanted signal.

These off-channel signals are typically suppressed by the channel-select filters (CSF) following the RX mixer. Up to the CSF all circuitry has to support the full dynamic range (DR) of the wanted signal and all off-channel signals, including sufficient margin to the noise and interference floor required for proper signal detection, present at the LNA input. For the low-noise amplifier (LNA) the floor is determined by the thermal noise of its input signal, and the maximum signal is limited by the supply voltage and its bias current. For subsequent stages the signal power is increased, and for power-consumption reasons this means some voltage gain (say 30 dB) is applied stressing the upper limit of the dynamic range as the supply voltage is (about) the same for all the circuitry.

To relax the dynamic-range requirements in later stages, channel-select filtering is applied and ideally (with brick-wall filters) this would result in only the wanted signal challenging the upper limit of the dynamic range after the CSF. Today's receivers typically implement the CSF as a passive pole at the mixer output followed by an active ladder, or biquad-based, low-pass filter resulting in a finite attenuation of the off-channel signals. To keep the thermal noise low, the filter capacitors have to be relatively large (the available thermal noise voltage $v_n$ across a capacitor C is $v_n^2 = kT/C$, where k is Boltzmann's constant and T is the absolute temperature) and they add significantly to the circuit area, and hence cost. These capacitors also add to the power consumption as a high bias current is required to drive them without generating too much distortion (which results in inter-modulation noise). In a multi-standard (e.g. GSM, WCDMA and LTE) receiver the CSF response has to be optimized for each mode, either by shifting the filter poles or by switching between fixed frequency filters, otherwise adjacent-channel suppression will be effective only for the mode with the widest bandwidth.

After the CSF the resulting signal is digitized in an analog-to-digital converter (ADC). Because the analog CSF has limited off-channel suppression, for component tolerance and signal integrity reasons, the maximum level of the signal out of the CSF will be set by a strong off-channel signal or TX leakage. Thus, the ADC has to have a higher dynamic range than what is required by the wanted signal alone. In practice this is accomplished by letting the wanted signal stay well below the ADC clipping level (except perhaps for the case when the wanted signal is approaching its maximum signal level in which case it is at least as strong as the off channel and no extra dynamic range margin is needed). This extra dynamic range increases the complexity, size, and power consumption of the ADC. The clipping point is close to the compression point ($CP_i$ and $CP_O$ for input- and output-referred compression, respectively) which is a more convenient way to measure the maximum signal level. The $CP_i$ ($CP_O$) is defined as the input (output) signal level where the gain drops by 1 dB from its small-signal value.

The ADC noise floor for the wanted signal (i.e. the on-channel noise floor) is typically similar to, or lower than, the corresponding noise floor at the CSF output. ADC off-channel noise can often be ignored as it is usually not limiting the design and it can advantageously be filtered out by subsequent digital filters.

A very popular ADC topology is the Delta-Sigma ADC. In this topology, the input signal is fed through a filter (e.g. a set of integrators) in front of a quantizer. The quantizer output is routed to a digital-to-analog converter (DAC) who's output is subtracted from the input signal at the ADC input forming a feedback loop.

To increase RX integration it is desirable to combine the ADC and channel-select filters such that (some) filter integrators also may contribute in suppressing the ADC noise. Further, for multi-standard receivers it is desirable to move most of the selectivity into the digital domain where a flexible and tighter filter response can be accomplished, and an ADC with a compression point that increases with the frequency offset would enable more filtering in the digital domain. Thus, a low on-channel noise floor and high off-channel compression point are desirable features of an ADC.

In WO 2012/073117 it has been suggested that the noise contribution of the ADC can be reduced by making it a part of the CSF. They suggest to replace the feedback resistor in a low-pass Rauch filter by an ADC-DAC cascade. By feeding the ADC symbols to a feedback DAC with the proper transfer gain, which replaces the feedback resistor, the filter behavior is preserved, except for the fact that the ADC noise now occurs inside the filter feedback loop and the filter integrator gain helps suppressing this noise. The noise shaping now has a zero at the origin causing the improvement to depend on the (normalized) filter bandwidth. Thus, the input-referred noise of a wide CSF contains less ADC noise than a CSF with a cut-off at the channel bandwidth. Thus, to fully exploit the ADC noise suppression, the CSF bandwidth needs to be wide causing poor attenuation for adjacent channels.

In summary, the circuit of that document has replaced a resistor in the Rauch low-pass CSF with an ADC-DAC cascade and accomplished a filtering ADC. This merged CSF and ADC yields an additional single zero in the ADC noise shaping reducing the input-referred on-channel ADC noise contribution. The analog-to-digital converter can be e.g. a Delta-Sigma converter. In the document it has also been shown that higher-order noise shaping can be accomplished by increasing the order of the Delta-Sigma modulator in the ADC itself. This is, however, equivalent to improving a stand-alone ADC and does not take any benefit from the CSF. Any integrators added to the Delta-Sigma modulator do not contribute to the CSF and will, thus, just add to the circuit area (cost), power consumption and aggravate any ADC modulator stability issues.

Although useful improvements are demonstrated in WO 2012/073117, the additional noise shaping provided by the CSF is only of first order, and there is a conflict with CSF and the signal bandwidth and, thus, there is a need for further improvements.

SUMMARY

Therefore, it is an object of embodiments of the invention to provide a frequency selective circuit, in which the shaping of ADC noise performed by the CSF can be extended to be of second or higher order.

According to embodiments of the invention the object is achieved in a frequency selective circuit configured to convert an analog input signal to a digital output signal, comprising an analog-to-digital converter configured to generate the digital output signal of the frequency selective circuit based on an analog input signal to the analog-to-digital converter; a digital-to-analog converter arranged to generate an analog feedback signal based on the digital output signal generated by the analog-to-digital converter, and an analog filter arranged to generate the analog input signal to the analog-to-digital converter based on the analog feedback signal generated by the digital-to-analog converter and an analog input signal to the frequency selective circuit. The object is achieved, when the analog filter comprises at least two integrators in series, each integrator having a feedback path comprising the analog-to-digital converter in cascade with a digital-to-analog converter, so that the overall noise transfer function of the frequency selective circuit has at least two zeros in addition to zeros in the noise transfer function of the analog-to-digital converter.

When the analog filter comprises two or more integrators in series and each integrator has a feedback path comprising the analog-to-digital converter in cascade with a digital-to-analog converter, the at least two additional zeros in the overall noise transfer function of the frequency selective circuit will extend the shaping of ADC noise performed by the CSF to be of second, or higher, order, which will relax the conflict between channel and CSF bandwidths as the slope of the noise shaping is much steeper.

In one embodiment each integrator of the analog filter provides a low pass filtering function having a cut-off frequency corresponding to a selected frequency band of the analog input signal to the frequency selective circuit. The analog-to-digital converter may then be configured to generate the digital output signal at a sampling rate that is significantly higher than the cut-off frequency of the integrators of the analog filter. When the cut-off frequency of the signal transfer function of the analog filter is a lot smaller than the sampling rate of the analog-to-digital converter, the circuit is enabled to have a pass band gain larger than unity in the analog filter without running into compression when receiving strong signals outside the filter pass band.

When the analog filter has a gain larger than unity the noise, clock jitter, and linearity requirements for the digital-to-analog converter(s) in the feedback path(s) are relaxed. This makes it easier to realize a large dynamic range compared to a circuit without filtering and gain.

In one embodiment, each integrator of the analog filter has a separate feedback path comprising a digital-to-analog converter arranged to generate an analog feedback signal to the input of that integrator. In this way the quantization noise will be subject to second or higher order noise shaping.

The circuit may be configured to have a substantially flat signal transfer function in the pass band of the analog filter, which allows a more accurate filter response.

In one embodiment, each integrator of the analog filter comprises an operational amplifier, a capacitor coupled between the output and an input of the operational amplifier and an input resistor coupled to said input of the operational amplifier. This is an RC integrator. Alternatively, the analog filter could also be implemented using a transconductor-C (Gm-C) type integrator, or other suitable active circuitry providing integrator-like properties.

In one embodiment, the circuit further comprises a resistor arranged to form a resonator loop around two integrators of the analog filter. This makes it possible to optimally distribute the zeros of the noise transfer function in the pass band of the filtering circuit, so that the noise shaping from the analog filter is improved and the noise requirements of the analog-to-digital converter can be relaxed even more.

The analog-to-digital converter may in one embodiment be a quantizer. Alternatively, the analog-to-digital converter may be a Delta-Sigma converter. The Delta-Sigma converter may be a first order or a higher order Delta-Sigma converter. In the case of a Delta-Sigma converter, the analog-to-digital converter may have a discrete-time loop filter or a continuous-time loop filter.

When the analog-to-digital converter is a Delta-Sigma converter the analog-to-digital converter may further comprise a cascade of integrators with feed-forward compensation. In this way a signal transfer function of the analog-to-digital converter can be achieved that affects the signal transfer function of the frequency selective circuit as little as possible by having a flat magnitude response and minimum phase shift.

In case of a Delta-Sigma converter having a continuous-time loop filter, a similar effect can be achieved when a resistor is coupled in series with the capacitor coupled between the output and an input of the operational amplifier of at least one of the integrators of the analog filter or of the loop filter of the analog-to-digital converter.

In some embodiments, the circuit is further configured with a zero inserted in the feedback path from the digital-to-analog converter to the analog filter. An insertion of a zero in the feedback path allows frequency compensation of the effects that the transfer function of the feedback digital-to-analog converter(s) may have on the signal transfer function of the overall frequency selective circuit. The zero may be implemented by a direct path from the output of the digital-to-analog converter to the output of the analog filter. Alternatively, when the analog-to-digital converter is a Delta-Sigma converter, the zero may be implemented by modified feedback coefficients of a loop filter of the Delta-Sigma converter.

BRIEF DESCRIPTION OF THE DRAWINGS

Embodiments of the invention will now be described more fully below with reference to the drawings, in which.

DETAILED DESCRIPTION

Figure 1:
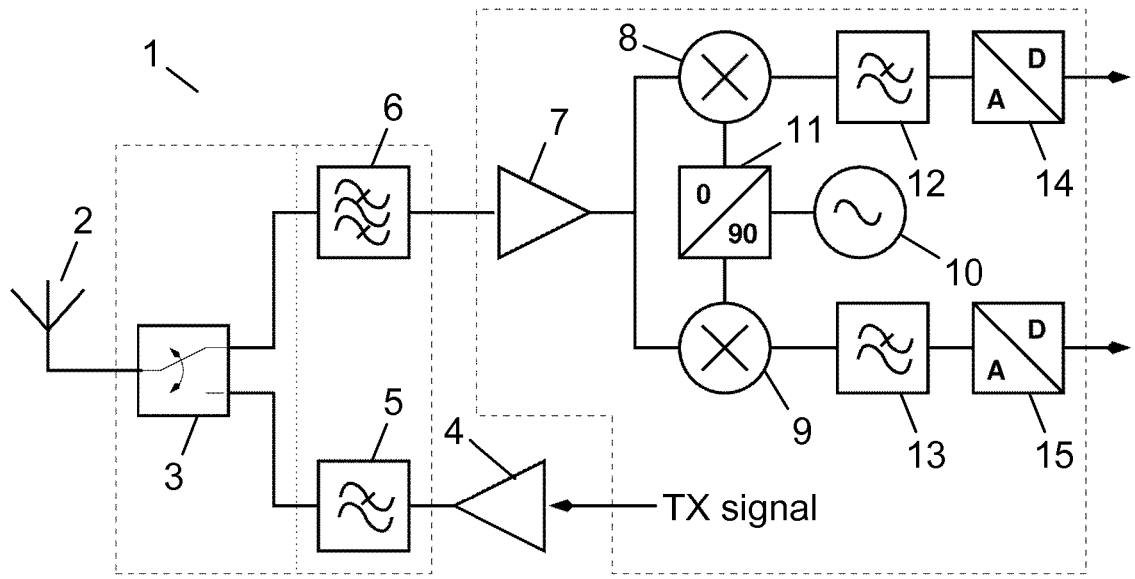
FIG. 1 shows a block diagram of a typical radio frequency transceiver.

FIG. 1 shows a block diagram of a typical RF transceiver 1 in which the invention can be used. The transceiver 1 has a receiver part and a transmitter part. Most modern transceiver solutions use direct conversion (or low IF) receiver and transmitter architectures to reduce complexity and minimize power consumption. The receiver and the transmitter use quadrature local oscillator signals.

An antenna 2 is connected to a transmitter/receiver switch 3. The transmitter part comprises a power amplifier 4 and a PA matching and filtering block 5, but will not be described in further detail here.

In the receiver part the signal from the transmitter/receiver switch 3 is fed to a duplexer or a RX filter 6, e.g. a surface-acoustic wave (SAW) filter, (for frequency-division duplex, FDD, or time-division duplex, TDD, systems, respectively) that provides the only frequency selectivity before the RX mixer. From the duplexer or RX filter 6 the signal is fed through a low noise amplifier 7 to RX quadrature mixers 8, 9 in which the received information is translated to baseband frequency (i.e. down-converted to DC or close to DC) by mixing the received signals with quadrature local oscillator signals. These are normalty generated by dividing a local oscillator signal from a local oscillator or synthesizer 10 responsible for frequency generation by a factor 2 or a higher even multiple in the divider 11. The two outputs from the mixers 8, 9 are an in-phase component and a quadrature component, and they are low pass filtered in the channel select filters 12 and 13 before they are converted to digital values in the analog-to-digital converter units 14 and 15 and further processed in the baseband processing stages.

In the RX-band, adjacent-channel signals and leakage from the terminal's own transmitter (TX) may be much stronger than the wanted signal. These off-channel signals are typically suppressed by the channel-select filters (CSF) 12, 13 following the RX mixers 8, 9. Up to the CSF all circuitry has to support the full dynamic range (DR) of the wanted signal and all off-channel signals, including sufficient margin to the noise and interference floor required for proper signal detection, present at the LNA input. For the low-noise amplifier (LNA) 7 the floor is determined by the thermal noise of its input signal, and the maximum signal is limited by the supply voltage and its bias current. For subsequent stages the signal power is increased, and for power-consumption reasons this means some voltage gain (say 30 dB) is applied stressing the upper limit of the dynamic range as the supply voltage is (about) the same for all the circuitry.

The following part of the description will relate to the channel select filter 12 or 13 In combination with the analog-to-digital converters 14 or 15.

Figure 2:
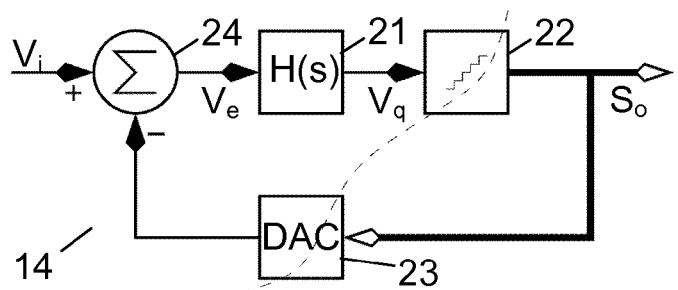
FIG. 2 shows a block diagram of a Delta-Sigma analog-to-digital converter.
Figure 3:
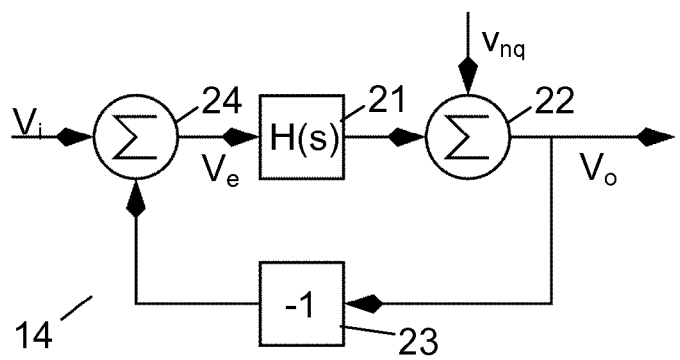
FIG. 3 shows a simple noise model of the Delta-Sigma analog-to-digital converter of FIG. 2.

As illustrated in FIG. 2, the analog-to-digital converter 14 (or 15) may be a Delta-Sigma ADC, which is a very popular ADC topology. In this topology, the input signal $V_i$ is fed through a filter 21 (e.g. a set of integrators) in front of the quantizer 22. The quantizer 22 only has a few output bits sampled at a rate much higher than the signal bandwidth; often the quantizer 22 is just a single bit comparator and only rarely more than four bits are used. The quantizer output $S_o$ is routed to a digital-to-analog converter (DAC) 23 who's output is subtracted from the input signal at the ADC input in the adder 24, forming a feedback loop. The quantizer output is also the digitized output of the ADC. The Delta-Sigma ADC thus acts like a signal follower, where the digital output stream represents the input signal (e.g. voltage). To enhance the ADC resolution, the digital ADC output stream is filtered and down-sampled to provide further selectivity and increased resolution of the wanted signal. FIG. 3 illustrates a simple noise model of the Delta-Sigma ADC of FIG. 2.

For in-band signals the Delta-Sigma ADC clipping occurs in the last stage (i.e. the quantizer) and results in an output sequence with mostly ones, or zeroes, for a single-bit comparator (for a multi-bit quantizer we get mostly sequences of the highest or the lowest code).

For off-channel signals and interference, clipping occurs progressively earlier in the signal chain as the frequency offset of the clipping signal increases (i.e. the frequency difference between the wanted and unwanted signals increases) and for very high frequency offsets it is typically the first ADC integrator that limits the signal. The first integrator is also the stage limiting the ADC lower-frequency noise floor. Hence, this stage has to be carefully designed both to handle linearity and noise which adds to its complexity. Also, the ADC on-channel noise floor has to be similar, or preferably lower, than the output on-channel noise floor of the CSF not to limit the RX sensitivity too much.

The Delta-Sigma ADC can be continuous or discrete time. In the former case the ADC filter is an analog continuous-time filter and sampling is done by the quantizer, and in the latter case, sampling is done before the ADC and the entire ADC is sampled, typically with switched-capacitor filters in the forward path. For noise reasons the ADC filter typically has a similar complexity as the preceding analog channel-select filter.

Figure 4:
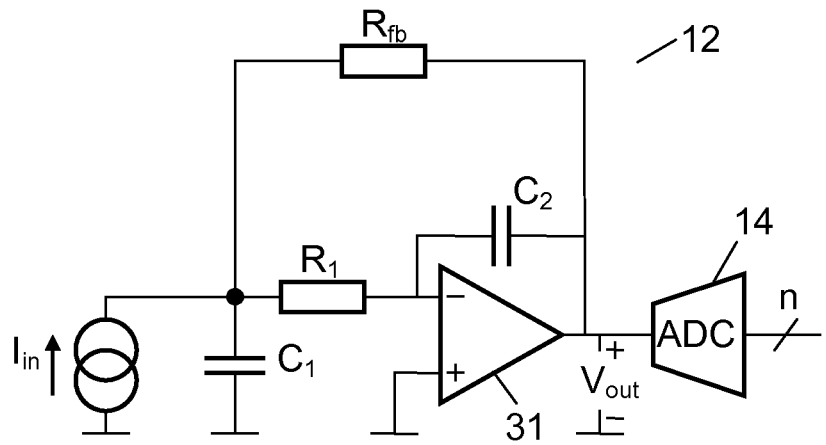
FIG. 4 shows an example of a known channel select filter, a so-called low pass Rauch filter.

An example of a known channel select filter 12, a so-called low pass Rauch filter, is shown in FIG. 4. The channel select filter 12 receives an analog input signal from a signal source $I_{in}$, which here represents the output of the down converting mixer 8. The channel select filter 12 comprises a low pass filtering capacitor $C_1$ and an integrator circuit, the latter comprising an operational amplifier 31, a capacitor $C_2$ and a resistor $R_1$. The output signal $V_{out}$ of the operational amplifier 31 is fed back to the inverting input of the operational amplifier 31 via the capacitor $C_2$ and to the input terminal via the resistor $R_{fb}$. The input terminal is connected to the inverting input via the resistor $R_1$. The non-inverting input of the operational amplifier 31 is connected to ground. The integrator acts as a low-pass filter, and the values of the capacitor $C_2$ and the resistor $R_1$ are selected to provide a cut-off frequency corresponding to the bandwidth of the wanted channel. The output signal $V_{out}$ of the channel select filter 12 is connected to the analog-to-digital converter 14 as in FIG. 1.

To increase RX integration it is desirable to combine the ADC and channel-select filters such that (some) filter integrators also may contribute in suppressing the ADC noise. Further, for multi-standard receivers it is desirable to move most of the selectivity into the digital domain where a flexible and tighter filter response can be accomplished, and an ADC with a compression point that increases with the frequency offset would enable more filtering in the digital domain. Thus, a low on-channel noise floor and high off-channel compression point are desirable features of an ADC.

Figure 5:
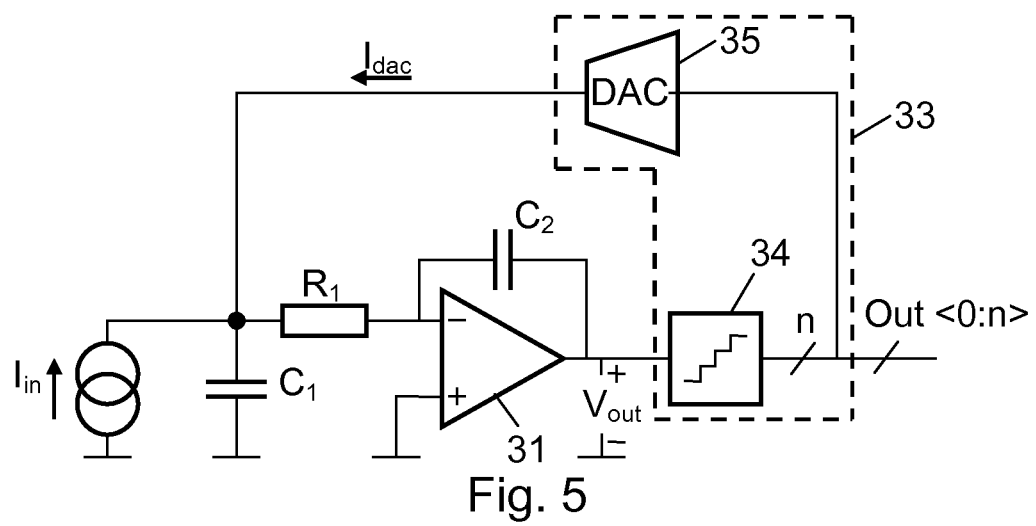
FIG. 5 shows a channel select filter, in which a feedback resistor has been replaced by an ADC-DAC cascade.

As mentioned above, It has been suggested in WO 2012/073117 that the noise contribution of the ADC can be reduced by making it a part of the CSF. They suggest to replace the feedback resistor $R_{fb}$ in the low-pass Rauch filter by an ADC-DAC cascade 33 comprising an analog-to-digital converter 34 and a digital-to-analog converter 35, as it is illustrated in FIG. 5. In the Rauch filter, the resistor $R_{fb}$ senses the filter output voltage, which essentially is the same signal as the ADC output. By feeding the ADC symbols to a feedback DAC with the proper transfer gain, which replaces $R_{fb}$, the filter behavior is preserved, except for the fact that the ADC noise now occurs inside the filter feedback loop and the filter integrator gain helps suppressing this noise. The noise shaping now has a zero at the origin causing the improvement to depend on the (normalized) filter bandwidth. Thus, the input-referred noise of a wide CSF contains less ADC noise than a CSF with a cut-off at the channel bandwidth. Thus, to fully exploit the ADC noise suppression, the CSF bandwidth needs to be wide causing poor attenuation for adjacent channels.

In summary, the circuit of that document has replaced a resistor $R_{fb}$ in the Rauch low-pass CSF with an ADC-DAC cascade 33 and accomplished a filtering ADC. This merged CSF and ADC yields an additional single zero in the ADC noise shaping reducing the input-referred on-channel ADC noise contribution. Although useful improvements are demonstrated there is a conflict with CSF and the signal bandwidth and, thus, there is a need for further improvements.

It is noted that in FIG. 5 the analog-to-digital converter 34 is illustrated as a simple quantizer. However, this ADC can also be e.g. a complete Delta-Sigma converter, such as the one shown in FIG. 2. In the above document it has also been shown that higher-order noise shaping can be accomplished by increasing the order of the Delta-Sigma modulator in the ADC itself. This is, however, equivalent to improving a stand-alone ADC and does not take any benefit from the CSF. Any integrators added to the Delta-Sigma modulator do not contribute to the CSF and will, thus, just add to the circuit area (cost), power consumption and aggravate any ADC modulator stability issues.

To better understand the merged CSF-ADC noise properties we can look at FIG. 3 again. Straight-forward analysis results in the following expression for the feedback-loop, or Delta-Sigma ADC, output signal.

$$V_o(s) = \frac{H(s)}{1+H(s)} \cdot V_i(s) + \frac{1}{1+H(s)} \cdot V_{nq}(s), \tag{1}$$

where s is the complex frequency and H(s) is the forward-path gain. For simplicity, but without loss of generality, we have used the common assumption of unity-gain feedback.

The first right-hand-side term in (1) corresponds to the signal transfer function (STF) and the second to the noise transfer function (NTF), respectively.

By referring the noise represented by $V_{nq}$ to the input of the feedback loop model we can more clearly see the effect the loop has on this noise and how it relates to the input signal. For a stand-alone ADC, $V_{nq}$ would typically represent the quantization noise but in the general case it may be any kind of noise originating after the filter (i.e. H(s)). $V_{nq}$ could also describe noise that is modeled as if it did originate after the filter but the noise process itself may be more complex.

To refer any output quantity back to the input we simply divide the output signal with the STF. Applying this to our noise model we get $$\hat{V}_i(s) = \frac{V_o(s)}{STF} = V_i(s) + \frac{1}{H(s)} \cdot V_{nq}(s). \tag{2}$$

Thus, when H(s) is represented by an integrator (i.e. H(s)=1/s) the suppression of $V_{nq}$ increases when the frequency decreases. That is, the lower-frequency on-channel noise gets more suppressed than the higher-frequency off-channel noise.

Now this model is derived for the ADC itself, when $V_{nq}$ typically would represent quantization noise, but it can actually be applied equally well for the merged CSF and ADC.

Thus, to increase the suppression of the ADC $V_{nq}$ it would be advantageous to use a filter with more than one integrator (as opposed to the Rauch filter used WO 2012/073117) when merging with the ADC.

Figure 6:
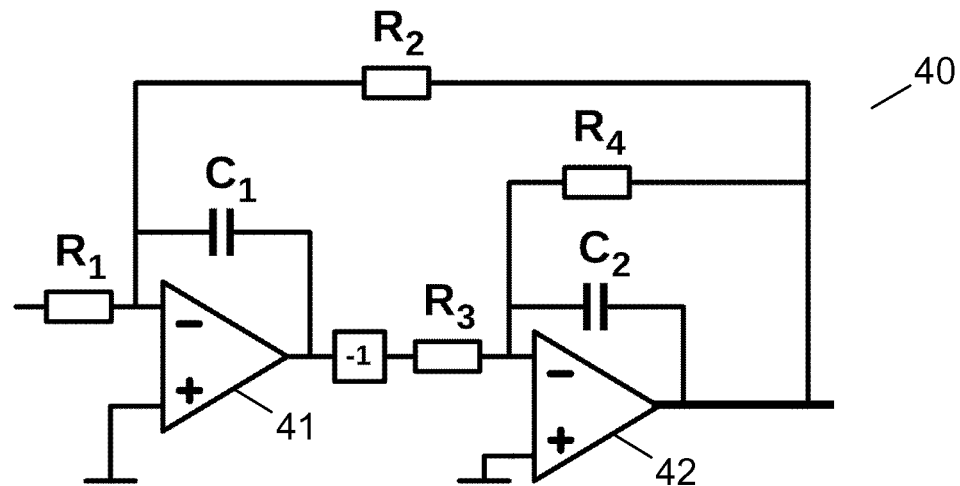
FIG. 6 shows an example of a Tow-Thomas biquad filter having two integrator circuits.

One such filter is, for example, the Tow-Thomas biquad filter 40, which is illustrated in FIG. 6, in which the filter 40 has two integrator circuits. The first integrator circuit comprises an operational amplifier 41, a capacitor $C_1$ and a resistor $R_1$. The output signal of the operational amplifier 41 is fed back to its inverting input via the capacitor $C_1$. The input signal to the filter is connected to the inverting input of the operational amplifier 41 via the resistor $R_1$. The non-inverting input of the operational amplifier 41 is connected to ground. The output signal of this first integrator circuit is connected to the input of a second integrator circuit, which similarly comprises an operational amplifier 42, a capacitor $C_2$ and a resistor $R_3$. The output signal of the operational amplifier 42 is fed back to its inverting input via the capacitor $C_2$. The signal from the first integrator circuit is connected to the inverting input of the operational amplifier 42 via the resistor $R_3$. The non-inverting input of the operational amplifier 42 is connected to ground. The output signal of the operational amplifier 42, which is also the output signal of the filter 40, can be connected to an analog-to-digital converter 14 as it was the case for the filter of FIG. 4, and it is also fed back to the inverting input of the operational amplifier 41 via the resistor $R_2$ and to the inverting input of the operational amplifier 42 via the resistor $R_4$. The integrators act as a low-pass filter, and the values of the capacitors $C_1$ and $C_2$ and the resistors $R_1$ and $R_3$ are selected to provide a cut-off frequency corresponding to the bandwidth of the wanted channel.

Figure 7:
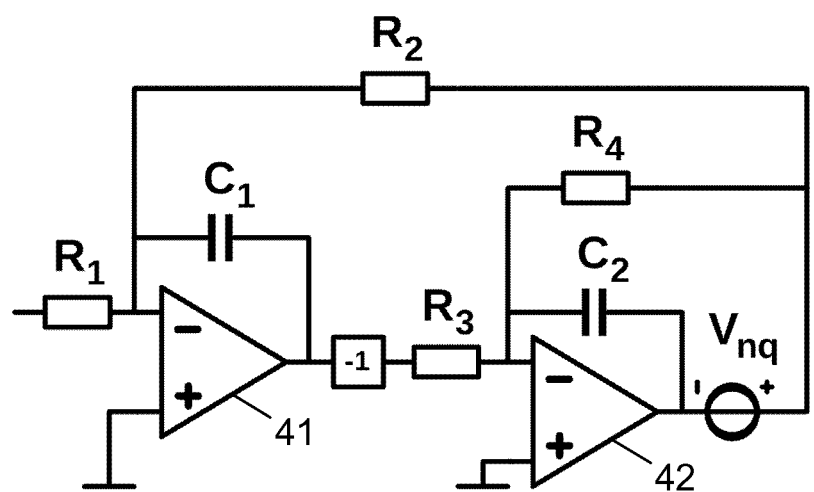
FIG. 7 shows the filter of FIG. 6 with ADC noise modelled as a voltage source.

When this filter is merged with an ADC, the ADC noise may be modeled via the voltage source $V_{nq}$ as illustrated in FIG. 7. This particular filter topology has undamped integrators, relative to $V_{nq}$, which will provide higher low-frequency forward-path gain and will, thus, suppress the on-channel noise more than damped ones will.

Figure 8:
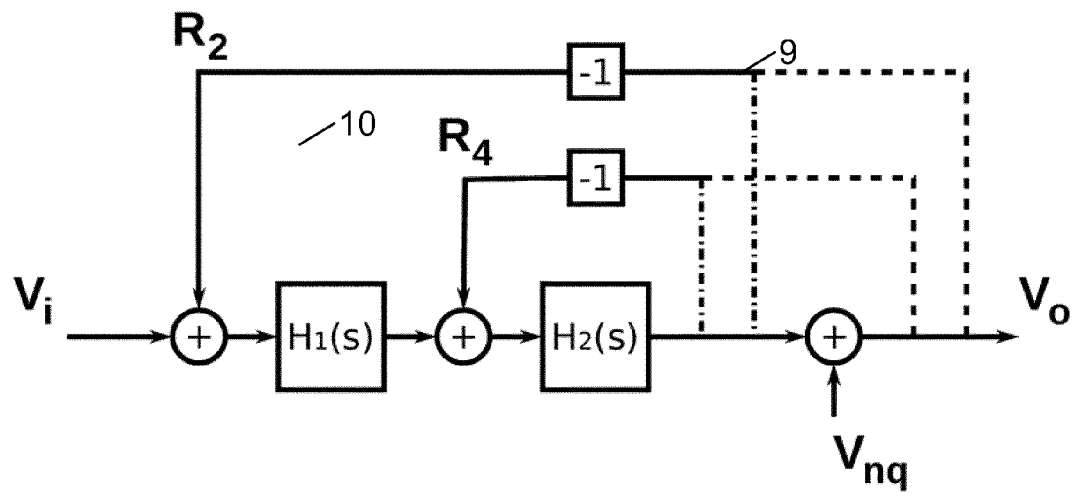
FIG. 8 shows a simplified Tow-Thomas biquad filter with alternative routings for feedback paths.

A problem with the Tow-Thomas example of FIG. 6 is the fact that we have two feedback paths, via $R_2$ and $R_4$, respectively. If we just replace one of the resistors with an ADC-DAC cascade, only the corresponding loop will benefit from noise shaping. It could be possible to replace either the feedback path via $R_2$, the feedback path via $R_4$ or both of them. A noise model illustrating these possibilities is shown in FIG. 8, which shows a simplified Tow-Thomas biquad with alternative routings for the $R_2$ and $R_4$ feedback paths outlined. The ADC quantization noise is represented by ($V_{nq}$) and DAC-based paths are shown with dashed lines and resistor ones with dash-dotted lines, respectively.

Straight-forward analysis of the three possible feedback element combinations, as shown in FIG. 8 (i.e. with one or two feedback DACs), results in the following noise transfer functions, NTFs, where $NTF_{R2}$ denotes $V_o/V_{nq}$ when $R_2$ is replaced by a DAC, $NTF_{R4}$ denotes $V_o/V_{nq}$ when $R_4$ is replaced by a DAC, and $NTF_{R2,R4}$ denotes $V_o/V_{nq}$ when both $R_2$ and $R_4$ are replaced by DACs.

$$NTF_{R_2,R_4} = \frac{1}{1 + H_2(s) + H_1(s)H_2(s)} \quad (3)$$

$$NTF_{R_2} = \frac{1 + H_2(s)}{1 + H_2(s) + H_1(s)H_2(s)} \quad (4)$$

$$NTF_{R_4} = \frac{1 + H_1(s)H_2(s)}{1 + H_2(s) + H_1(s)H_2(s)}. \quad (5)$$

When $H_1(s)$ and $H_2(s)$ are implemented as integrators, i.e. $H_1(s)$ and $H_2(s) \propto 1/s$, then $NTF_{R2,R4}$ will have a double zero at the origin, $NTF_{R2}$ a single, and $NTF_{R4}$ unity gain with a notch around the filter corner frequency, respectively. An intuitive explanation to this difference in NTFs is that each NTF is the inverse gain of the signal path from $V_i$ to the injection point of $V_{nq}$ with the corresponding feedback element(s) open circuited. For example, substituting $R_2$ benefits from a first-order zero only as there is just one integrator in the path from $V_i$ to $V_{nq}$ (amplified by the ratio $R_4/R_3$). Asymptotically $NTF_{R4}$ is unity except in the filter transition region resulting in no significant noise shaping for on-channel ADC noise. Thus it is preferable to replace both feedback paths.

Figure 9:
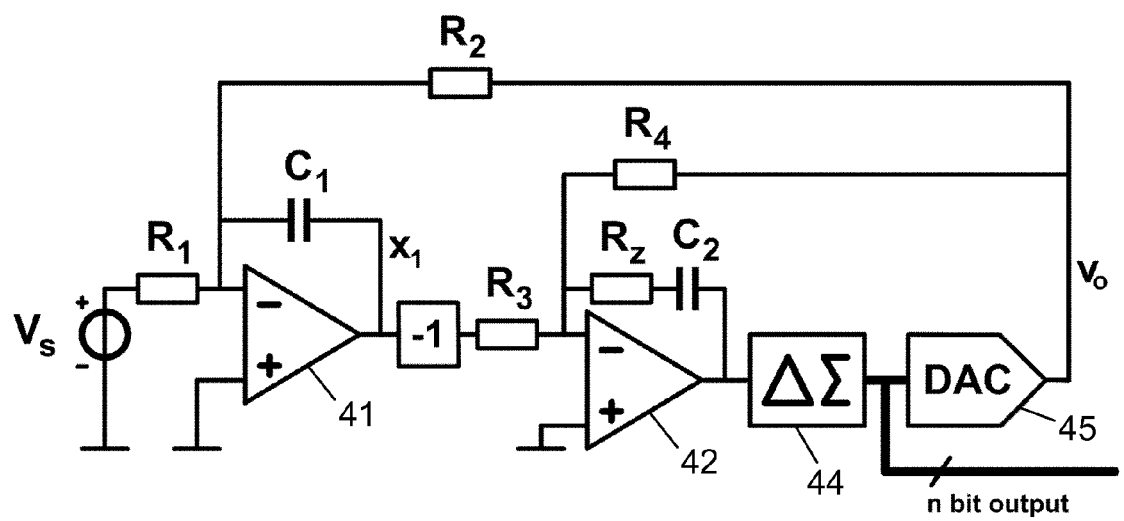
FIG. 9 shows a Tow-Thomas biquad filter merged with an analog-to-digital converter using one common digital-to-analog converter for both feedback paths.
Figure 10:
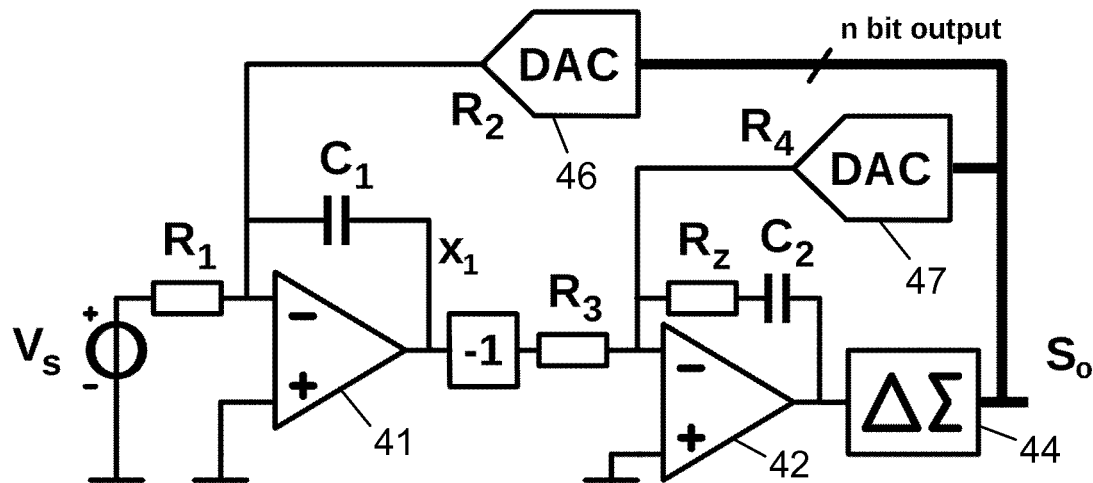
FIG. 10 shows a Tow-Thomas biquad filter merged with an analog-to-digital converter using a separate digital-to-analog converter in each feedback path.

Thus the merging of the Tow-Thomas biquad filter with the ADC can be implemented e.g. by using one common DAC for both feedback paths (i.e, keeping the resistors) as illustrated in FIG. 9, or by using a separate DAC in each feedback path as illustrated in FIG. 10.

In FIG. 9, the output of the second integrator circuit (i.e. operational amplifier 42) is connected to an ADC-DAC cascade comprising an analog-to-digital converter 44 and a digital-to-analog converter 45, and the output of the digital-to-analog converter 45 is fed back to the inverting input of the operational amplifier 41 via the resistor $R_2$ and to the inverting input of the operational amplifier 42 via the resistor $R_4$.

In FIG. 10, the output of the second integrator circuit (i.e. operational amplifier 42) is again connected to an analog-to-digital converter 44, but the output of this analog-to-digital converter 44, which is also the output of the merged filter and ADC, is now connected to two digital-to-analog converters, of which digital-to-analog converter 46 replaces resistor $R_2$ and provides the feedback signal to the inverting input of the operational amplifier 41, while digital-to-analog converter 47 replaces resistor $R_4$ and provides the feedback signal to the inverting input of the operational amplifier 42.

In both FIGS. 9 and 10 the analog-to-digital converter 44 is shown as a Delta-Sigma converter. It is noted that the converter may be a first order or a higher order Delta-Sigma converter, and just like the circuit of FIG. 5 it may also just be a quantizer.

Figure 11:
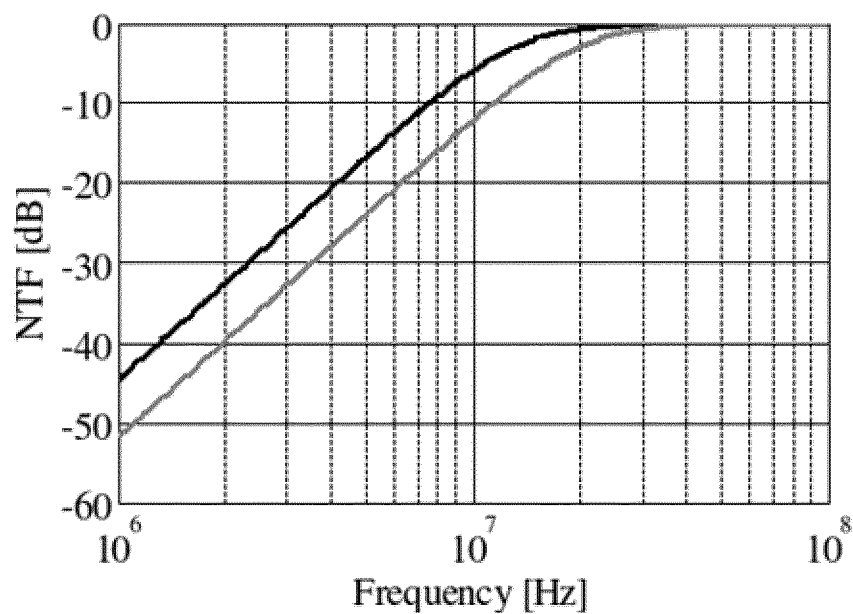
FIG. 11 shows the transfer function of noise from the Delta-Sigma modulator to the filter output of FIG. 9 or FIG. 10.

Recognizing that the quantization error occurs in the quantizer, i.e. the ADC of the ADC-DAC cascade, it can be seen that by having one ADC but multiple DACs we can replace both $R_2$ and $R_4$ by DACs, see FIG. 10, and the resulting quantization noise would be subject to second-order noise shaping in the Tow-Thomas example as both integrators are undamped when DACs are used instead of resistors. This is illustrated in FIG. 11, which shows the transfer function of noise from the Delta-Sigma modulator to the filter output of FIG. 9 or FIG. 10. The upper curve shows the noise transfer function for 13 MHz cutoff frequency, while the lower curve shows the noise transfer function for 20 MHz cutoff frequency.

Of course replacing a bidirectional resistor with a unidirectional DAC may cause deviations in the CSF characteristics but these are linear effects and can easily be compensated for. In this example both resistors/DACs are connected to virtual ground nodes so the current flow is essentially unidirectional and no compensation is required.

We still have to compromise between the CSF and channel bandwidth but with the proposed method the NTF slope is much steeper relaxing this problem significantly, see FIG. 11.

The filter described above is a second order filter, i.e. it comprises two integrator circuits in series, but the effect can be improved by using a filter of a higher order comprising additional integrator circuits and then using a corresponding number of feedback paths with a ADC-DAC cascade. By having multiple feedback DACs connected to the same ADC we can extend the approach to other filter topologies (than the Tow-Thomas filter) with multiple feedback loops, while having only one source of quantization noise.

Figure 12:
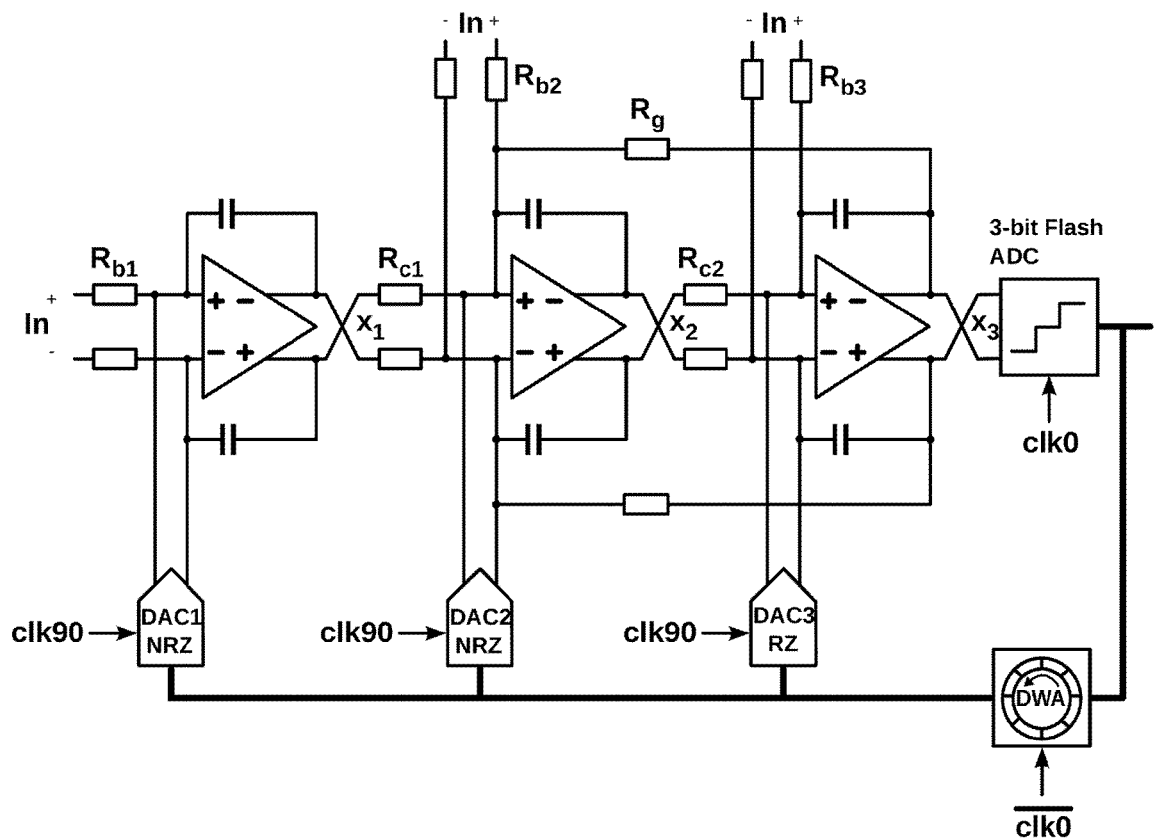
FIG. 12 shows an example of a third-order continuous time Delta-Sigma modulator with additional feed-forward paths.
Figure 13:
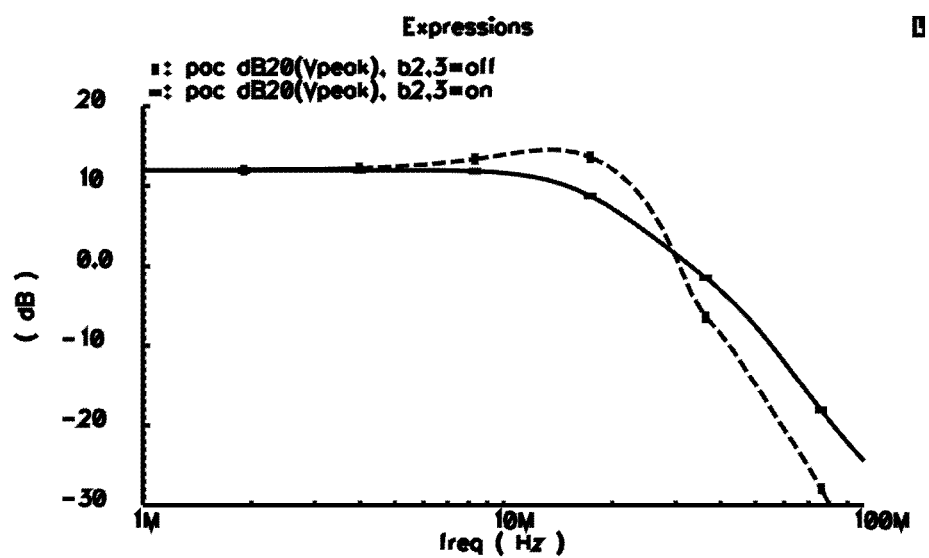
FIG. 13 shows a signal transfer function of a merged Delta-Sigma converter and filter.

It is noted that adding the ADC inside the CSF feedback loop(s) may cause stability problems due to the finite ADC bandwidth. Provided the ADC bandwidth is significantly higher than the CSF bandwidth, it suffices to insert a resistor in series with one or more of the CSF integrator capacitors (here $C_1$ and $C_2$) generating one or more zeroes that will improve the filter phase margin, see for example $R_z$ in FIGS. 9 and 10. It is also possible to improve stability by shaping the ADC Delta-Sigma modulator frequency response, e.g. increasing its bandwidth by adding feed-forward paths as shown in FIG. 12, which illustrates an example of a third-order continuous time Delta-Sigma modulator with additional feed-forward phase compensation paths ($R_{b2}$ and $R_{b3}$). In this case the Delta-Sigma modulator is a balanced or differential circuit. The effect of using feed-forward compensation is illustrated in FIG. 13, which shows the signal transfer function STF of a merged Delta-Sigma converter and filter. The solid curve shows the STF when the feed-in path via $R_{b2}$ and $R_{b3}$ in the Delta-Sigma converter is enabled. The dashed curve shows the STF when the feed-in path via $R_{b2}$ and $R_{b3}$ in the Delta-Sigma converter is disabled.

The DAC(s) will also add some loop delay, similarly to the ADC, but a DAC typically has much higher intrinsic bandwidth, or less delay, than the ADC does. The DAC delay depends on the clock frequency (over-sampling ratio).

The clocking of the ADC-DAC combination may also incur an extra delay but with a high enough clocking frequency any of the above techniques can be used to compensate for the aggregate phase-delay effect of the ADC, DAC and clocking. However, the clock frequency should be minimized to save power. Another way of DAC delay compensation is described later. Thus the analog-to-digital converter may be configured to generate the digital output signal at a sampling rate that is significantly higher than the bandwidth of the integrators of the analog filter.

The problem with DAC delay is dealt with in further detail below.

For simplicity, but without loss of generality, single-ended filters have been used in the examples but in actual designs balanced, or differential, signals and components are probably preferable.

In a traditional CSF-ADC cascade, e.g. as shown in FIG. 4, the on-channel ADC noise, referred back to the CSF input, will add to the input noise of the CSF without any additional noise shaping (i.e. the ADC noise is subject to the same shaping by the CSF as the signal itself is). Typically the ADC is then designed to have the same, or lower, on-channel noise floor as the CSF in order not to degrade the overall dynamic range too much. With the ADC inside the CSF, as proposed in WO 2012/073117, an additional first-order (only) shaping is provided, however, resulting in a conflict between noise shaping and CSF bandwidth. With the method disclosed here we extend the first-order ADC noise shaping by the CSF to be of second, or higher, order, which will relax the conflict between channel and CSF bandwidths as the slope of the noise shaping is much steeper.

Thus for the same equivalent noise at the CSF input we can design the ADC with a higher noise floor, resulting in lower power consumption and smaller circuit area. For example, the ADC input integrator can employ smaller capacitors, requiring less bias current, or the ADC filter can be of lower order (lower order Delta-Sigma modulator). Alternatively, for the same power consumption we can achieve a lower overall noise floor as the ADC contribution will decrease, or a combination of higher ADC noise floor and better overall noise performance.

The examples and the analyses have been done with continuous-time converters. The same principles apply in a sampled (e.g. switched capacitor) Delta-Sigma ADC as long as aliasing distortion is properly accounted for (e.g. by having a sufficiently high forward-path attenuation for signals that would fold into the wanted signal bandwidth or a high enough sampling frequency to avoid folded frequency components to compromise the wanted signal).

Other types of ADCs than the Delta-Sigma may also be used. Like in the discrete-time Delta-Sigma case, proper handling of aliasing may then be needed.

An ADC-DAC cascade as described above has a flat frequency response for typical signals of interest. By inserting a digital filter, between the ADC and any of its associated DACs, inductors, capacitors and more complex network responses can be synthesized, in addition to the resistor discussed above. Clearly this may have an impact on the loop delay as well as the required resolution of a DAC preceded by a filter. The same ADC output may be filtered (or unfiltered) in different ways to each associated DAC.

The exemplary CSFs have been of low-pass type. The described approach may also be extended to other well-known types of CSF, like band-pass and complex filters (with I and Q paths).

A number of improvements and additional features may be implemented in the circuits described above, and some of these are mentioned in the following.

The circuits merging an analog filter (i.e. the CSF) and an analog-to-digital converter described above can also be illustrated as in FIG. 14 showing a frequency selective circuit, comprising an analog-to-digital converter ADC, a feedback digital-to-analog converter DAC and an analog filter $L_1$. The analog filter $L_1$ could, as an example, be implemented as the second order filter shown in FIG. 10. $V_i$ is the input signal to the analog filter, $V_x$ is the analog signal from the filter to the ADC, $S_o$ is the digital output signal from the circuit, which is also connected to the feedback DAC, and $V_{o1}$ is the analog feedback signal from the DAC to the input of the filter.

Figure 14:
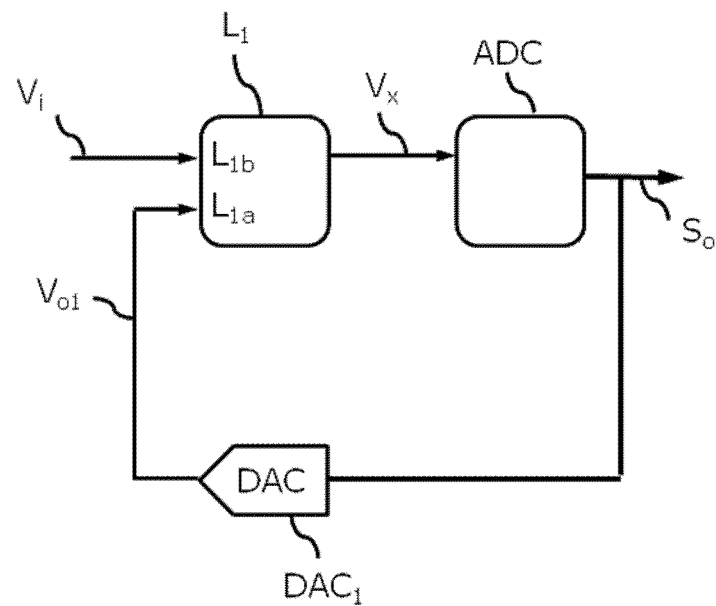
FIG. 14 shows another way of illustrating the merging of an analog filter and an analog-to-digital filter in a frequency selective circuit.

The transfer functions of the analog filter $L_1$ can be written as $L_{1a}=V_x/V_{o1}$ and $L_{1b}=V_x/V_i$. The signal transfer function (STF) and noise transfer function (NTF) of the frequency selective circuit in FIG. 14 are $$STF=L_{1b}/(1-L_{1a})$$

$$NTF=1/(1-L_{1a})$$

This frequency selective circuit is different from a regular continuous-time Delta-Sigma modulator in that the cutoff frequency (or bandwidth) of its STF (realized by $L_1$) is a lot smaller than the sampling rate of its ADC, because, as mentioned previously, it corresponds to the bandwidth of the wanted channel.

A benefit of this is that the channel select filtering provided by the frequency selective circuit enables it to have a pass band gain larger than unity in its analog filter without running into compression when receiving strong signals outside the filter pass band. The fact that the filter can have large gain is an important feature, for example providing the benefit of relaxing the noise, clock jitter, and linearity requirements for the feedback DAC(s). This makes it easier to realize a large dynamic range (DR) compared to a circuit without filtering and gain.

Even though the analog filter poles are optimized to achieve the desired STF (instead of the optimal NTF), it still provides noise shaping of the analog noise and quantization noise injected in the ADC.

Figure 15:
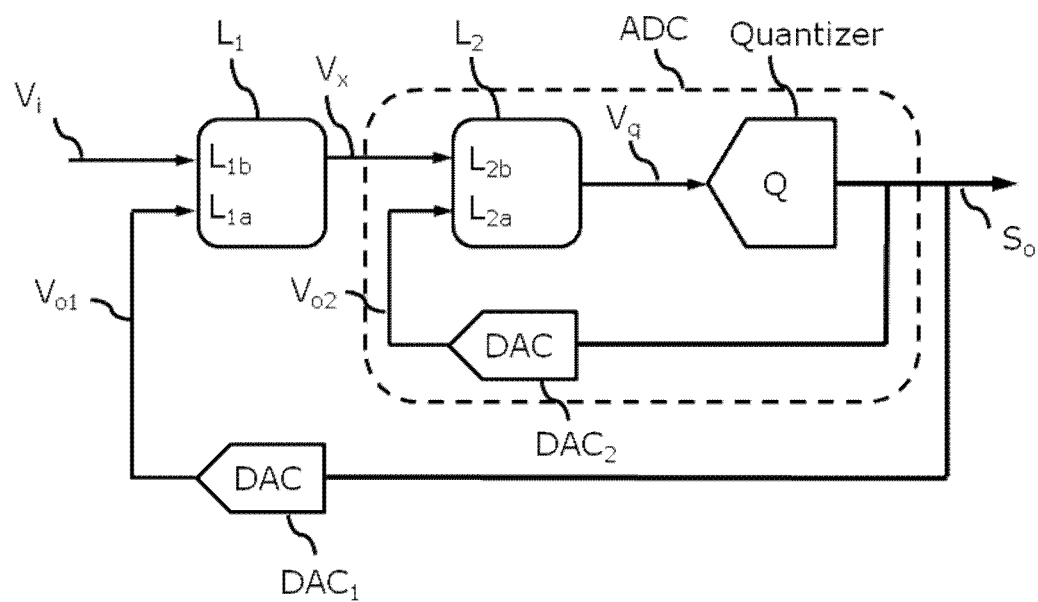
FIG. 15 shows the circuit of FIG. 14 when the analog-to-digital filter is a Delta-Sigma modulator.

As also disclosed already, to further reduce the quantization noise, the ADC may be a Delta-Sigma modulator, as shown in FIG. 15, where the Delta-Sigma modulator comprises the filter $L_2$, the quantizer Q and a feedback DAC designated $DAC_2$. The transfer function of $L_2$ changes both the STF and NTF of the frequency selective circuit. While the NTF improves in the frequency band of interest, the STF is degraded by the transfer functions of $DAC_1$ and $STF_2$. These cause the STF to peak at frequencies where there are large blocking signals. Thus the signal transfer function STF and the noise transfer function NTF of the circuit can now be written as $$STF = L_{1b} * STF_2 / (1 - L_{1a} * L_{DAC1} * STF_2)$$

$$NTF = 1/(1 - L_{1a} * L_{2b} - L_{2a})$$

As mentioned above, some limitations of the circuit described in WO 2012/073117 and shown in FIG. 5 are that due to the second order Rauch filter, the filter order is limited to two (no other analog filters are described), and the analog filtering part gives only a first order noise shaping of the noise from the ADC.

Above, frequency selective circuits are disclosed in which it is possible to increase the order of the analog filter, so that the STF of the filtering circuit has a sharper roll off outside its pass band and a higher order (better) noise shaping is provided. That improves the selectivity of the filtering circuit and relaxes the noise requirements of the ADC to a much larger extent.

Figure 16:
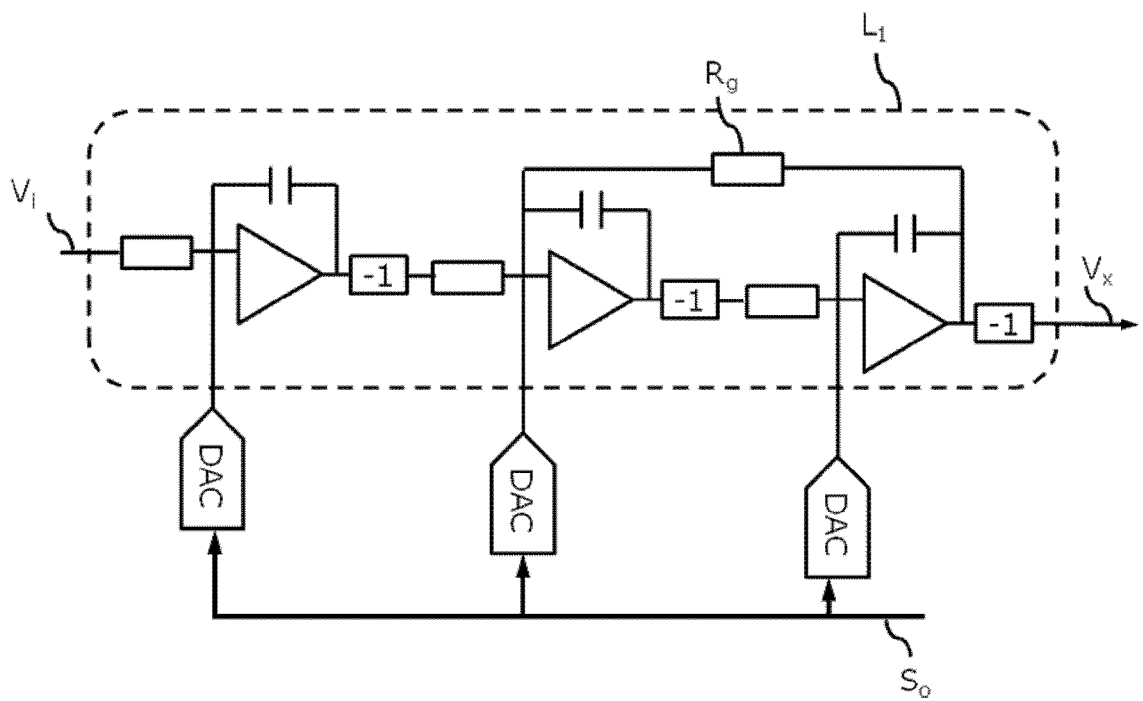
FIG. 16 shows an example of a third order analog filter with separate feedback DACs using a resistor forming a resonator loop around two of the integrators.
Figure 17:
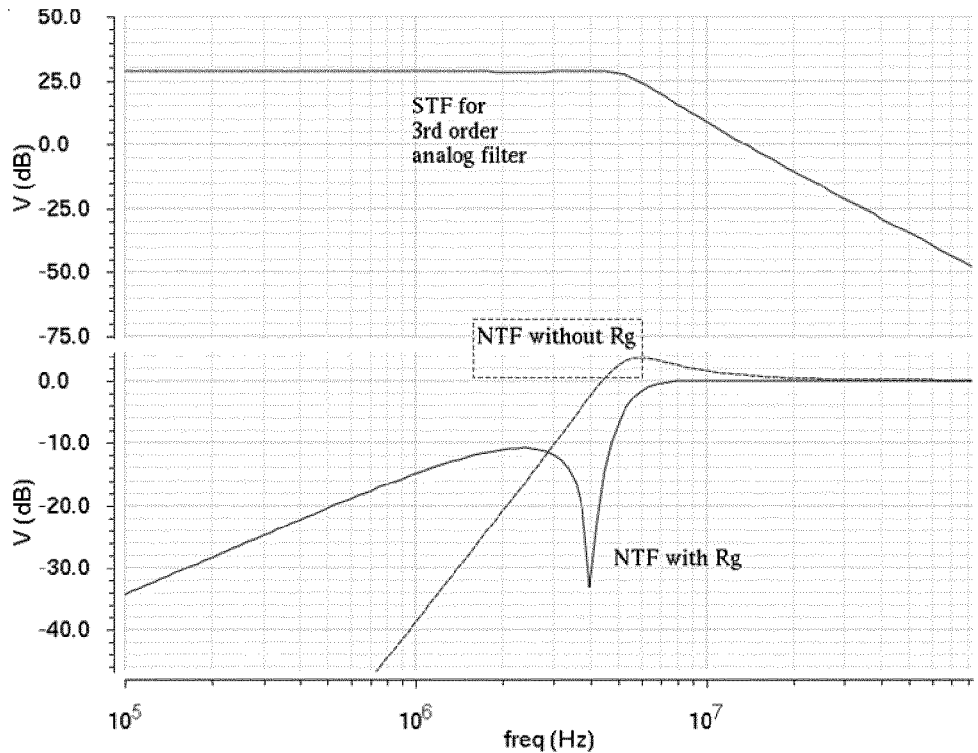
FIG. 17 shows the signal-transfer-function and the noise-transfer function for a third order analog filter, with and without the resonator loop around two of the integrators.

A further improvement can be obtained by using a resonator loop inside the analog filter, which makes it possible to optimally distribute the NTF zeroes in the pass band of the filtering circuit, having the benefit of improving the noise shaping from the analog filter to relax the noise requirements of the ADC even more (without increasing the number of integrators or affecting the STF). The noise shaping provided by the analog filter $L_1$ can be improved by the use of a resonator loop around two of the integrators, using a resistor ($R_g$), as shown in FIG. 16, which illustrates an example of a third order analog filter with separate feedback DACs. A resonator loop is formed around two of the integrators using resistor $R_g$ to be able to place the NTF zeros optimally in the pass band of the filtering circuit. By proper selection of $R_g$, two of the NTF zeros can be moved from their original position at DC up to $$\omega_z = \sqrt{(1/(R_g R_{c2} C_2 C_3))}$$

where $R_{c2}$ is the resistor connected between the second and third integrator, $C_2$ is the integrator capacitor of integrator 2, and $C_3$ is the integrator capacitor of integrator 3. FIG. 17 shows the STF and NTF with and without the resonator loop implemented by $R_g$ for a third order analog filter having 4.5 MHz cutoff frequency. It can be clearly seen that moving the NTF zeros to about 90% of the cutoff frequency improves the high frequency attenuation provided by the integrators of the analog filter. The optimal location of the NTF zeros is the one minimizing the noise contributed by the Delta-Sigma modulator and therefore varies depending on the input noise spectrum of the Delta-Sigma modulator.

In some embodiments, further improvements of the circuit may be implemented as described below.

A problem of the frequency selective circuits presented above can be that the signal transfer function of the overall filter is affected by the transfer function $L_{DAC1}$ of the feedback DACs (due to sample/hold (S&H) and delay), and the signal transfer function $STF_2$ of the Delta-Sigma modulator. The signal transfer function of the frequency selective circuit shown in FIG. 15 is:

$$STF = L_{1b} * STF_2 / (1 - L_{1a} * L_{DAC1} * STF_2)$$

As shown below, using a regular second order Delta-Sigma modulator with a continuous-time cascade-of-integrator with feedback (CIFB) loop filter may have a large impact on the STF of the filtering circuit. This STF can be very different from the desired one, if $L_{DAC1}$ and $STF_2$ have a magnitude response different from unity, and give phase shift of the signal. Thus, if not properly designed or compensated, these might degrade the filter attenuation, and affect the stability of the overall frequency selective circuit. One way to get around these problems could be to increase the ADC clock frequency relative to the cutoff frequency of the analog filter, but this increases the power consumption.

Regarding the DAC transfer function, it is noted that the frequency domain transfer function of $DAC_1$ is the cascade of a S&H $L_{SH}(s)=(1-e^{-sT})/(sT)$ and a delay $L_{delay}(s)=e^{-sT}$, which gives $L_{DAC1}(s)=(1-e^{-sT})/(sT)*e^{-sT}$ The sampling operation can be approximated by a first order Pade approximation $L_{SH}(s) \approx (2/T)/(s+2/T)$ or a second order Pade approximation $L_{SH}(s) \approx (12/T^2)/(s^2+6s/T+12/T^2)$.

The frequency domain transfer function for the DAC delay, $e^{-sT_d}$, can also be modeled by a second order Pade approximation $L_{delay}(s) \approx (1-sT_d/2+s^2 T_d^2/8)/(1+sT_d/2+s^2 T_d^2/8)$.

Figure 18:
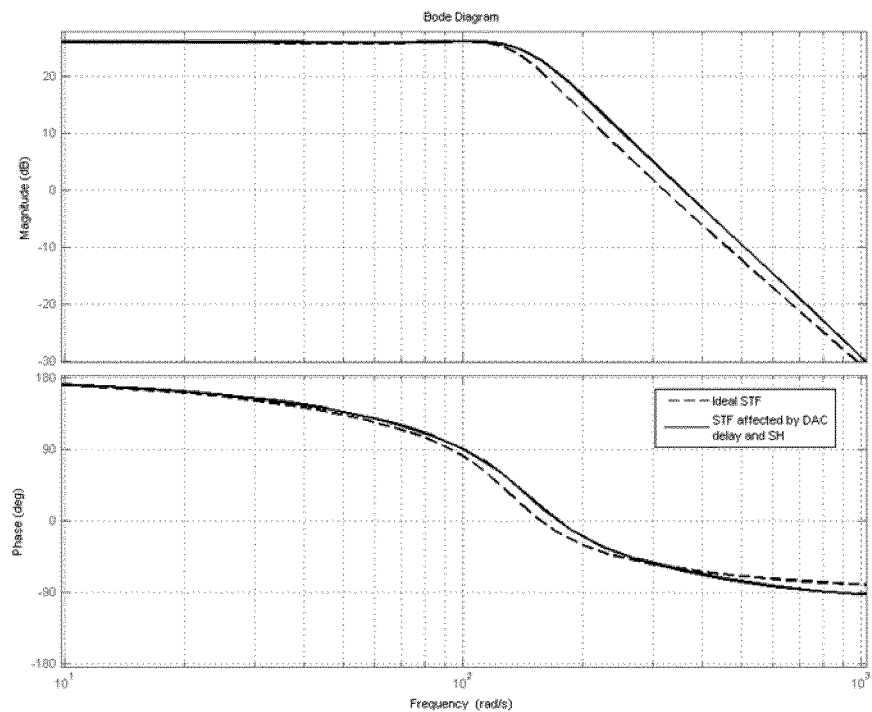
FIG. 18 shows a plot illustrating the effect on the signal transfer function of the frequency selective circuit caused by the transfer function of the feedback digital-to-analog converters due to sample/hold and delay.

Inserting the two second order approximations into the analytical expression for the signal transfer function (STF) and noise transfer function (NTF) of a frequency selective circuit with a third order analog filter, DAC delay of $T_d=0.5/f_{clk}$, and ADC clock rate of $f_{clk}=1/T=32*f_{BW}$) it can be seen that the filter attenuation is degraded by 3 dB, see FIG. 18. For lower clock frequencies it will be worse. FIG. 18 is a plot showing the effect on the STF of the frequency selective circuit having a third order analog filter, half a clock cycle DAC delay, and oversampling ratio of 16. In this case, the deviation is about 3-4 dB. The dashed line shows the ideal STF, and the solid line the actual transfer function of the filtering circuit.

Figure 19:
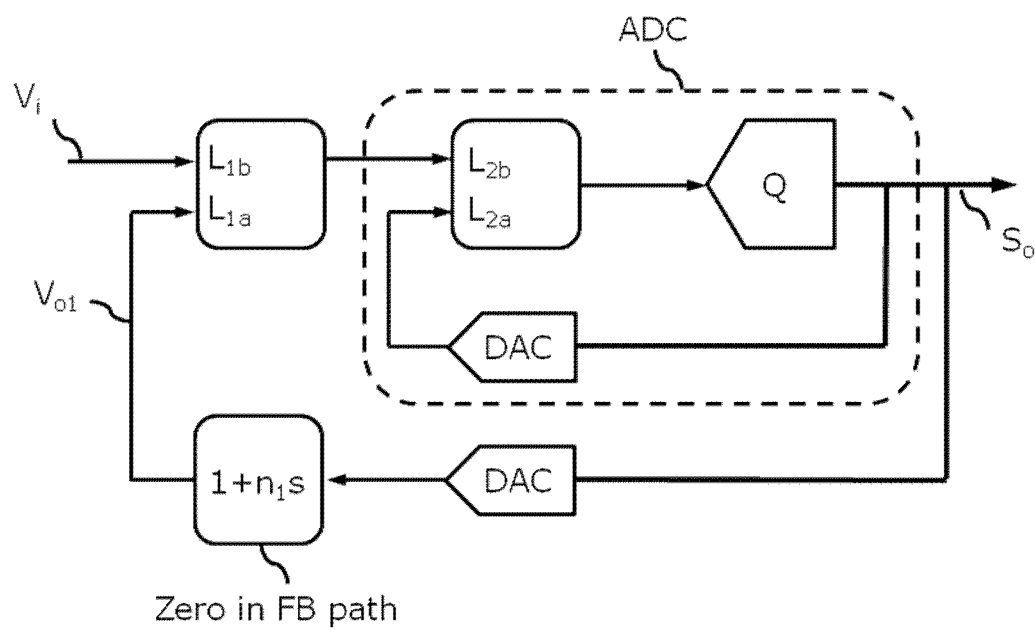
FIG. 19 shows how frequency compensation of the DAC S&H and DAC delay can be done by inserting a zero into the feedback path.
Figure 20:
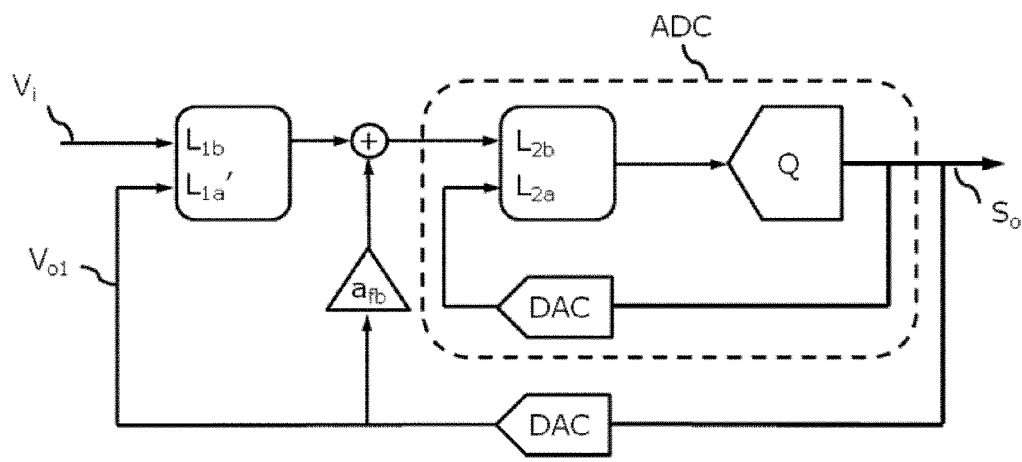
FIG. 20 shows how the zero of FIG. 19 can be implemented by adjusting the feedback coefficients of the analog filter and adding a direct path from the feedback DAC to the output of the analog filter.

To get an accurate filter transfer function without increasing the clock frequency, it is advantageous to make a frequency compensation of the DAC effects (S&H and delay). The frequency compensation of the DAC S&H and DAC delay can be done by inserting a zero into the feedback path, as shown in FIG. 19 that illustrates the filtering circuit with a zero implemented in series with the feedback path of the analog filter to compensate for the S&H and delay transfer functions. Fortunately, the zero does not have to be implemented as a separate circuit, but can be implemented by adjusting the feedback coefficients of the analog filter properly, and adding a direct path from $V_{o1}$ to $V_x$ (i.e. the output of the analog filter) as shown in FIG. 20.

Figure 21:
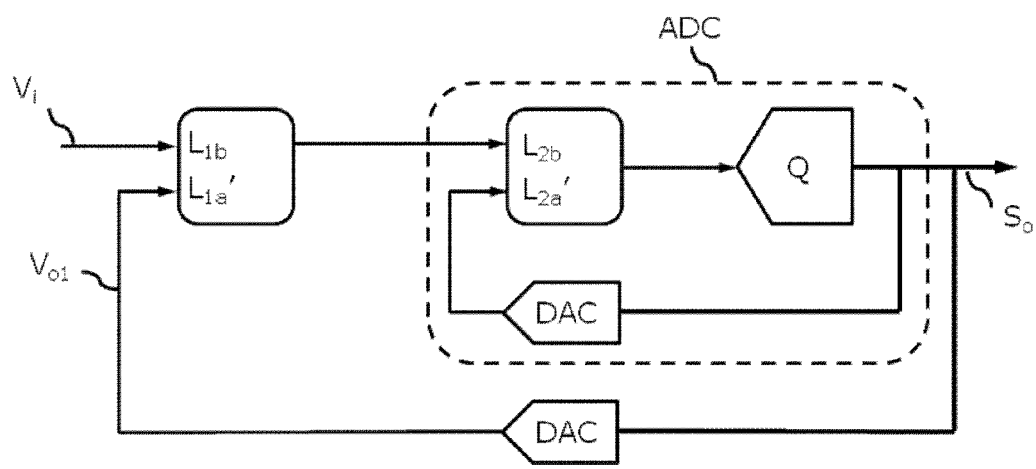
FIG. 21 shows how the zero of FIG. 19 can be implemented by adjusting the feedback coefficients of the Delta-Sigma modulator loop filter.

In the case of a Delta-Sigma ADC the loop filter $L_2$ of the Delta-Sigma already provides a feedback path from $S_o$ to the summing node of the first integrator of $L_2$. Therefore, the direct path $a_{fb}$ of FIG. 20 can instead be implemented by properly modifying the feedback coefficients of the Delta-Sigma modulator loop filter $L_2$. Thereby, as shown in FIG. 21 no additional circuits are needed to implement the zero. Note that the transfer functions $L_{1a}$ and $L_{2a}$ were however modified to $L_{1a}'$ and $L_{2a}'$.

Using a zero in the feedback path of the analog filter compensates the effect of S&H and delay in $DAC_1$, and creates an accurate STF for the filtering circuit. Using this idea, it is possible to reduce the clock frequency without reducing the dynamic range. This was not previously possible.

Figure 22:
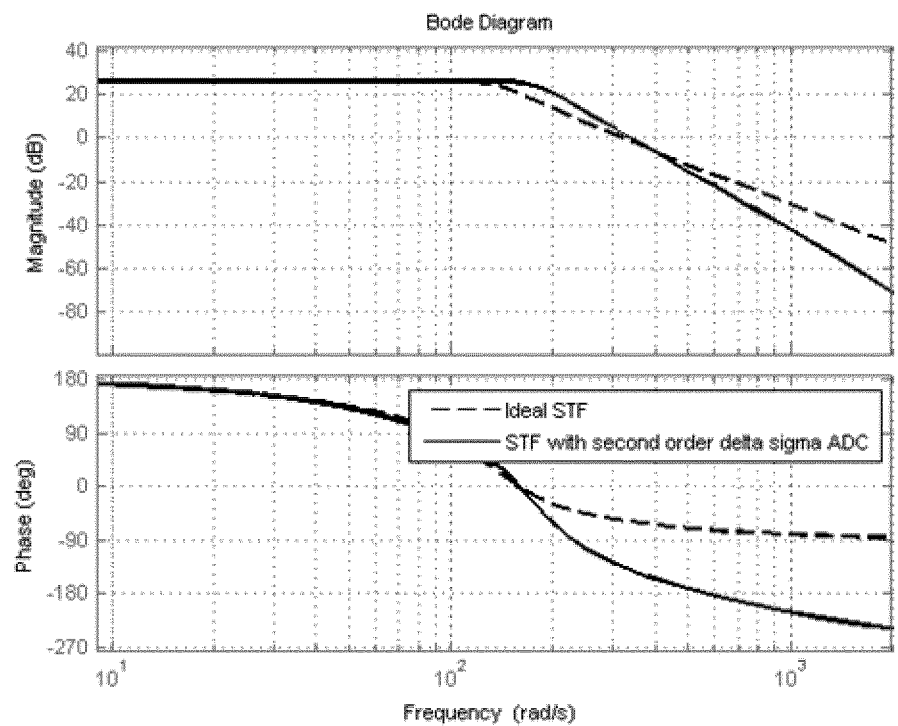
FIG. 22 shows a plot illustrating the effect on the signal transfer function of the frequency selective circuit caused by the signal transfer function of the analog-to-digital converter.

As mentioned above, also the signal transfer function $STF_2$ of the ADC is important for the overall STF of the filtering circuit. Realizing the ADC with a standard second order continuous-time Delta-Sigma modulator, the overall loop gain order of the filtering circuit increases (by 2) and therefore the order of the STF of the filtering circuit also increases (by 2), which moves the system poles out of their wanted positions, see FIG. 22 showing the effect on the STF of the frequency selective circuit when realizing the ADC using a regular second order Delta-Sigma modulator with CT (CIFB) loop filter. This results in reduced filter attenuation in the adjacent channels and potential stability problems.

To get an accurate filter transfer function without increasing the clock frequency, it is advantageous to design the loop filter $L_2$ of the Delta-Sigma modulator so that its signal-transfer function $STF_2$ has a flat magnitude response and minimum phase shift ($STF_2(s)=1$ from DC to sufficiently high frequencies). The signal transfer function of the Delta-Sigma modulator can be improved in different ways, by proper design of $L_2$, depending on whether a continuous-time (CT) or a discrete-time (DT) modulator is chosen. The preferred Delta-Sigma loop filter topology $L_2$ is a bit different depending on whether it is a DT or a CT modulator. In both cases the goal is to achieve an $STF_2$ which affects the STF of the filtering circuit as little as possible by having a flat magnitude response and minimum phase shift.

Figure 23:
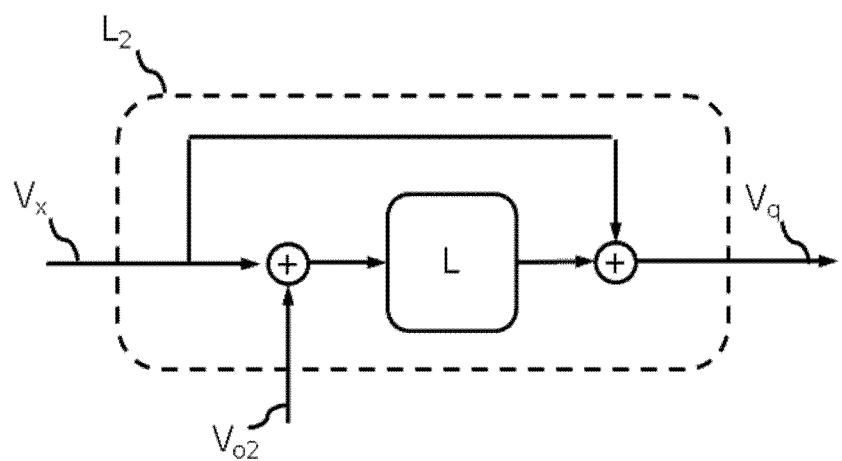
FIG. 23 shows an example of how the signal transfer function of the analog-to-digital converter can be implemented to minimize its effect on the signal transfer function of the frequency selective circuit.

If the Delta Sigma modulator uses a DT loop filter, $STF_2$ can be made identical to 1 if $L_2$ is on the form being shown in FIG. 23, in which $STF_2=1$ below the Nyquist frequency, and the noise transfer function of the Delta-Sigma modulator is $NTF_2=1/(1+L)$. L might be of any order giving any order noise shaping without affecting $STF_2$. This allows the desired $STF=L_{1b}/(1-L_{1a})$ to be realized. The loop filter $L_2$ can be implemented in at least two ways, i.e. either by the use of a cascade of integrators with feed forward compensation (CIFF), or by the use of a cascade of integrators with feedback compensation (CIFB). The principles are not limited to any specific loop filter order.

In the case of a CT Delta Sigma modulator, the magnitude and phase cannot be equal to 1 arbitrarily high in frequency, since a CT Delta Sigma modulator always has inherent anti-alias filtering. However, its frequency response ($STF_2$) can be improved e.g. by using one of the methods described below.

One way of improving the frequency response of the CT Delta Sigma modulator is to use feed forward paths as it is illustrated with resistors $R_{b2}$ and $R_{b3}$ in FIG. 12 that shows an example of a third-order continuous time Delta-Sigma modulator with additional feed-forward phase compensation paths ($R_{b2}$ and $R_{b3}$).

Another way of improving the frequency response of the CT Delta Sigma modulator is to implement a zero using a resistor connected in series with the feedback capacitors of the integrators (see Rz of FIGS. 9 and 10). This resistor may be placed either in the analog filter or in the loop filter of the Delta-Sigma modulator, or even both if more than one zero is desired.

By realizing the loop filter $L_2$ of the Delta-Sigma modulator as described above it is possible to have high order $L_2$ (good noise shaping) without degrading the desired filter attenuation. It is also likely to improve the stability. This was not previously possible.

Although various embodiments of the present invention have been described and shown, the invention is not restricted thereto, but may also be embodied in other ways within the scope of the subject-matter defined in the following claims.

The invention claimed is:

1. A frequency selective circuit configured to convert an analog input signal to a digital output signal, comprising:
an analog-to-digital converter configured to generate the digital output signal of the frequency selective circuit based on an analog input signal to the analog-to-digital converter;
a digital-to-analog converter arranged to generate an analog feedback signal based on the digital output signal generated by the analog-to-digital converter;
an analog filter arranged to generate the analog input signal to the analog-to-digital converter based on the analog feedback signal generated by the digital-to-analog converter and an analog input signal to the frequency selective circuit, wherein the analog filter comprises at least two integrators in series, each integrator having a feedback path comprising the analog-to-digital converter in cascade with a digital-to-analog converter, so that the overall noise transfer function of the frequency selective circuit has at least two zeros in addition to zeros in the noise transfer function of the analog-to-digital converter; and
a resistor arranged to form a resonator loop around two integrators of the analog filter.

2. The circuit of claim 1, wherein each integrator of the analog filter is configured to provide a low pass filtering function having a cut-off frequency corresponding to a selected frequency band of the analog input signal to the frequency selective circuit.

3. The circuit of claim 2, wherein the analog-to-digital converter is configured to generate the digital output signal at a sampling rate that is significantly higher than the cut-off frequency of the integrators of the analog filter.

4. The circuit of claim 1, wherein the analog filter has a gain larger than unity.

5. The circuit of claim 1, wherein each integrator of the analog filter has a separate feedback path comprising a digital-to-analog converter arranged to generate an analog feedback signal to the input of that integrator.

6. The circuit of claim 1, wherein the circuit is configured to have a substantially flat signal transfer function in the pass band of the analog filter.

7. The circuit of claim 1, wherein each integrator of the analog filter comprises an operational amplifier, a capacitor coupled between the output and an input of the operational amplifier and an input resistor coupled to said input of the operational amplifier.

8. The circuit of claim 1 wherein the analog-to-digital converter is a quantizer.

9. The circuit of claim 1, wherein the analog-to-digital converter is a Delta-Sigma converter.

10. The circuit of claim 9, wherein the analog-to-digital converter is a higher order Delta-Sigma converter.

11. The circuit of claim 9, wherein the analog-to-digital converter has a discrete-time loop filter.

12. The circuit of claim 9, wherein the analog-to-digital converter has a continuous-time loop filter.

13. The circuit of claim 9, wherein the analog-to-digital converter comprises a cascade of integrators with feedforward compensation.

14. The circuit of claim 12, further comprising a resistor coupled in series with the capacitor and coupled between the output and an input of the operational amplifier of at least one of the integrators of the analog filter or of the loop filter of the analog-to-digital converter.

15. The circuit of claim 1, wherein the circuit is further configured with a zero inserted in the feedback path from the digital-to-analog converter to the analog filter.

16. The circuit of claim 15, wherein the zero is implemented by modifying the feedback coefficients of the analog filter and introducing a direct path from the output of the digital-to-analog converter to the output of the analog filter.

17. The circuit of claim 15, wherein the analog-to-digital converter is a Delta-Sigma converter and the zero is implemented by modified feedback coefficients of both the analog filter and the Delta-Sigma converter.

* * * * *